United States Patent [19]
Shiga et al.

[11] Patent Number: 5,498,572
[45] Date of Patent: Mar. 12, 1996

[54] METHOD OF MANUFACTURING SEMICONDUCTOR DEVICE

[75] Inventors: Toshihiko Shiga; Ryo Hattori; Tomoki Oku, all of Itami, Japan

[73] Assignee: Mitsubishi Denki Kabushiki Kaisha, Tokyo, Japan

[21] Appl. No.: 312,960

[22] Filed: Sep. 30, 1994

Related U.S. Application Data

[62] Division of Ser. No. 150,885, Nov. 12, 1993, abandoned.

[30] Foreign Application Priority Data

Jun. 25, 1993 [JP] Japan .................... 5-154642

[51] Int. Cl.⁶ .................... H01L 21/44; H01L 21/28
[52] U.S. Cl. .................... 437/190; 437/192; 437/203; 437/194; 437/177; 148/DIG. 100
[58] Field of Search .................... 757/767, 764, 757/763, 770, 768, 769; 437/190, 183, 203, 177, 912, 175, 176, 192, 194, 190, 203; 156/644.1

[56] References Cited

U.S. PATENT DOCUMENTS

| | | | |
|---|---|---|---|
| 4,845,543 | 7/1989 | Okikawa et al. | 257/784 |
| 4,857,141 | 8/1989 | Abe et al. | 156/644.1 |
| 4,985,750 | 1/1991 | Hoshino | 257/767 |
| 5,041,393 | 8/1991 | Ahrens et al. | 437/912 |
| 5,108,950 | 4/1992 | Wakabayashi et al. | 437/190 |

FOREIGN PATENT DOCUMENTS

| | | | |
|---|---|---|---|
| 0127281 | 3/1984 | European Pat. Off. . | |
| 0209654 | 5/1986 | European Pat. Off. . | |
| 0305296 | 8/1988 | European Pat. Off. . | |
| 339871 | 4/1989 | European Pat. Off. . | |
| 353120 | 7/1989 | European Pat. Off. . | |
| 412185 | 8/1989 | European Pat. Off. . | |
| 0402061 | 6/1990 | European Pat. Off. . | |
| 60-66465 | 4/1985 | Japan | 257/767 |
| 62-76550 | 4/1987 | Japan . | |
| 62-89355 | 4/1987 | Japan | 257/764 |
| 0128153 | 6/1987 | Japan | 437/203 |
| 0105529 | 4/1990 | Japan | 437/203 |
| 0125427 | 5/1990 | Japan | 437/203 |
| 31570 | 1/1991 | Japan . | |
| 396276 | 4/1991 | Japan . | |
| 1207010 | 12/1968 | United Kingdom . | |
| 9312558 | 11/1992 | WIPO . | |

*Primary Examiner*—Tuan H. Nguyen
*Attorney, Agent, or Firm*—Leydig, Voit & Mayer

[57] ABSTRACT

A method for manufacturing a semiconductor device including forming an electrode on a part of a semiconductor substrate, depositing an insulating film on the semiconductor substrate and on the electrode, and forming a contact hole penetrating through the insulating film to expose a part of the electrode; forming a barrier metal layer on the electrode in the contact hole, on the internal side surface of the contact hole, and on the surface of the insulating film; and depositing a metal layer on the barrier metal layer and patterning the metal layer and the barrier metal layer to form a wiring layer wherein the barrier metal layer comprises a metal that does not form an intermetallic material by solid state diffusion with either of the electrode and the metal layer even at elevated temperatures.

8 Claims, 6 Drawing Sheets

(Prior Art)

METHOD OF MANUFACTURING SEMICONDUCTOR DEVICE

This disclosure is a divisional of application Ser. No. 08/150,885, filed Nov. 12, 1993 now abandoned.

FIELD OF THE INVENTION

The present invention relates to a method for producing a semiconductor device and, more particularly, to a technique for connecting an electrode with a wiring layer or a wire.

BACKGROUND OF THE INVENTION

FIGS. 6(a)–6(e) are sectional views illustrating process steps for connecting an electrode and a wiring layer in a conventional method of producing a compound semiconductor device.

Initially, a front surface of a GaAs substrate 1 is covered with a first insulating film 2, and a resist pattern 3 is formed on the insulating film 2 using a conventional photolithographic technique. Using the resist pattern 3 as a mask, the first insulating film 2 is dry etched to expose a region of the GaAs substrate 1 where an electrode is to be formed (FIG. 6(a)).

In the step of FIG. 6(b), Au-Ge alloy, Ni, and Au are successively deposited over the entire surface of the GaAs substrate 1 to form an electrode metal film 4 comprising Au-Ge/Ni/Au. Then, the resist pattern 3 and overlying portions of the metal film 4 are removed using a lift-off technique, resulting in an electrode 4a as shown in FIG. 6(c).

In the step of FIG. 6(d), the first insulating film 2 and the electrode 4a are covered with a second insulating film 7, and a contact hole 7a is formed penetrating through the second insulating film 7 using conventional photolithography and etching technique. Then, an Au film 6 for wiring is deposited over the substrate.

Thereafter, as illustrated in FIG. 6(e), the Au film 6 is patterned in a desired shape using an etching process, resulting in a wiring layer 6a.

In the above-described process steps, since the metal film 4 comprises Au-Ge/Ni/Au, the electrode 4a produces an ohmic contact with the GaAs substrate 1. Since the metal film 6 for wiring comprises Au, the wiring layer 6a is connected to the electrode 4a with high thermal and mechanical stability. In addition, the contact resistance between the wiring layer 6a and the electrode 4a is reduced.

With increasing requirements for small-sized and highly-integrated semiconductor devices in recent years, finer wiring patterns have been needed. In the conventional compound semiconductor device, however, since Au is employed for the wiring layer 6a, which is patterned by sputter etching or ion beam etching but cannot be patterned by reactive ion etching (RIE) that provides a fine patterning, a fine wiring pattern is not attained. Since Al can be patterned by RIE, it should be thought that an Al wiring layer is employed in the compound semiconductor device. In this case, however, if the device is subjected to a heat treatment at about 300° C. after the formation of the Al wiring layer, an undesirable solid phase reaction of Al and Au occurs at the junction between the Al wiring layer and the ohmic electrode formed on the GaAs substrate, i.e., the Au-Ge/Ni/Au electrode 4a, whereby an intermetallic compound, such as $AuAl_2$, is formed at the junction. The intermetallic compound increases the contact resistance and reduces the mechanical strength, adversely affecting the performance and reliability of the device.

On the other hand, in a semiconductor device employing an Si substrate, if Au is in contact with the Si substrate, trapping centers for trapping carriers are formed within the Si substrate, adversely affecting the semiconductor device characteristics. In order to make a favorable ohmic contact with the Si substrate, an Al or Al base alloy is usually employed for the electrode and an Au wire is bonded on the electrode. The Au wire is employed in the bonding process because a nail head bonding process which is not restricted in the bonding direction can be adopted using the Au wire in a package including a plurality of leads, these leads can extend in more than one direction, whereby a favorable connection between the Au wire and each lead is achieved.

As described above, if heat is applied to the junction between Al and Au, Al and Au easily react with each other. Therefore, also in the above-described semiconductor device, when the Au wire is bonded on the Al electrode, an intermetallic compound, such as $AuAl_2$, is formed at the junction, increasing contact resistance and reducing mechanical strength. In order to suppress the generation of the intermetallic compound, the initial stage in the bonding process is conventionally carried out in a time as short as possible at a low temperature to reduce the solid phase diffusion between Au and Al. However, no matter how short the bonding time at the low temperature bonding is, Au and Al easily react with each other, so that it is impossible to completely prevent the generation of the intermetallic compound.

SUMMARY OF THE INVENTION

It is an object of the present invention to provide a semiconductor device including an electrode and a wiring layer which are stably connected to each other with reduced contact resistance and no intermetallic compound at the junction therebetween even if the electrode and the wiring layer comprise different metals that form an intermetallic compound at the junction when heat is applied.

It is another object of the present invention to provide a semiconductor device including an electrode and a bonding wire which are connected to each other with no intermetallic compound at the junction therebetween even if the electrode and the wire comprise different metals that are easily diffused into each other.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a semiconductor device, an electrode and a wiring layer comprising different metals which form an intermetallic compound at the junction therebetween when heat is applied are connected via a barrier metal layer which prevents solid phase diffusion with the metals of the electrode and the wiring layer even if heat is applied. Therefore, the electrode and the wiring layer are connected with reduced contact resistance and high reliability.

According to a second aspect of the present invention, in a semiconductor device, a metal electrode is covered with a barrier metal layer which prevents solid phase diffusion with the metal electrode and a wire comprising a metal different from the metal of the electrode even if heat is applied, a metal layer comprising the same metal as the wire is disposed on the barrier metal layer, and the wire is bonded to the metal layer. Therefore, the electrode and the wire are connected with reduced-contact resistant and high reliability.

DETAILED DESCRIPTION OF THE PREFERRED EMBODIMENTS

Figure 1A:
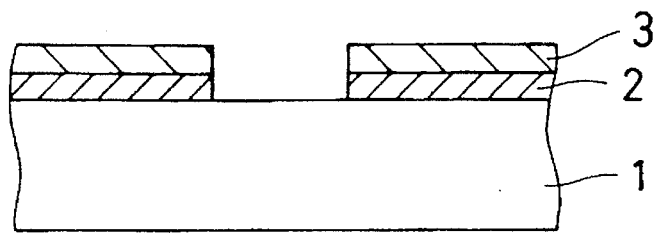
FIGS. 1(a)–1(e) are sectional views illustrating process steps for connecting an electrode and a wiring layer in a method of manufacturing a semiconductor device in accordance with a first embodiment of the present invention.

FIGS. 1(a)–1(e) are sectional views illustrating process steps for connecting an electrode and a wiring layer according to a first embodiment of the present invention. In the figures, the same reference numerals as in FIGS. 6(a)–6(e) designate the same or corresponding parts. Reference numeral 8 designates a WSiN film and numeral 8a designates a patterned WSiN film. Reference numeral 9 designates an Al film and numeral 9a designates a wiring layer comprising Al.

Figure 1B:
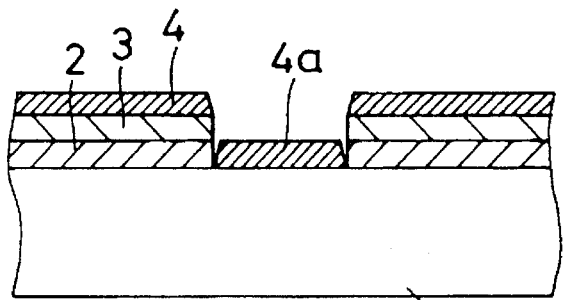
Figure 1C:
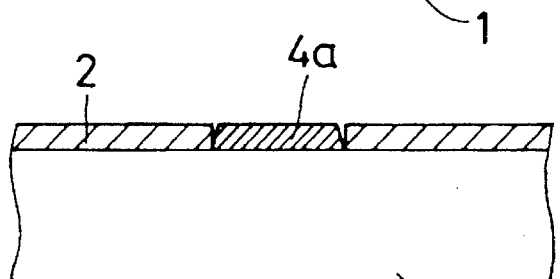
Figure 6:
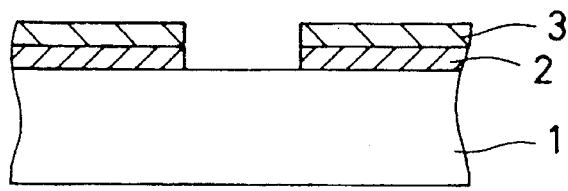
FIGS. 6(a)–6(e) are sectional views illustrating process steps for connecting an electrode and a wiring layer in a method of manufacturing a semiconductor device in accordance with the prior art.
Figure 6:
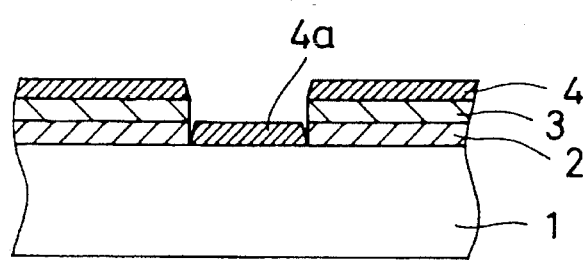
Figure 6:
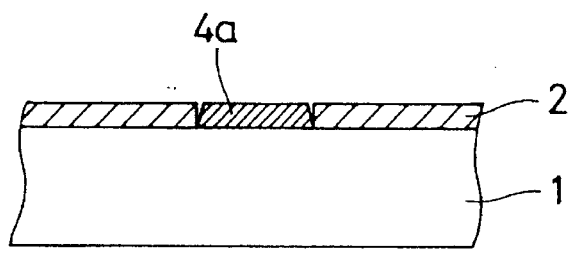
Figure 6:
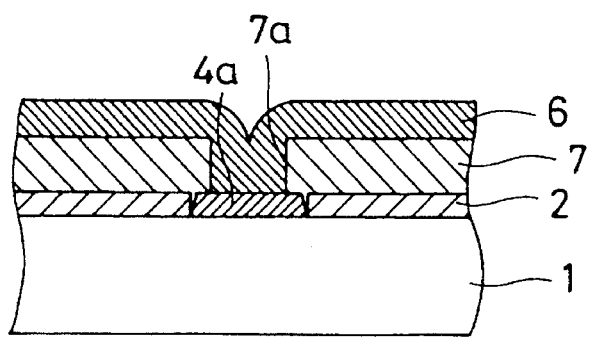
Figure 6:
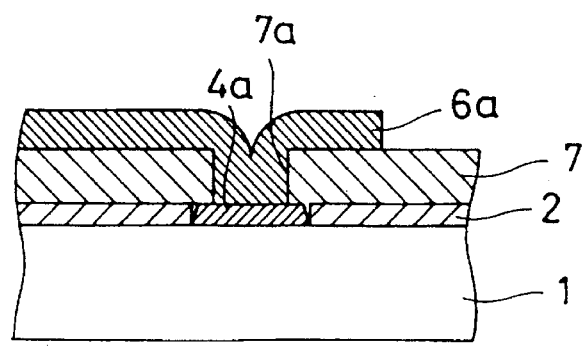

The steps illustrated in FIGS. 1(a)–1(c) are identical to those already described with respect to FIGS. 6(a)–6(c) and, therefore, do not require repeated description.

Figure 1D:
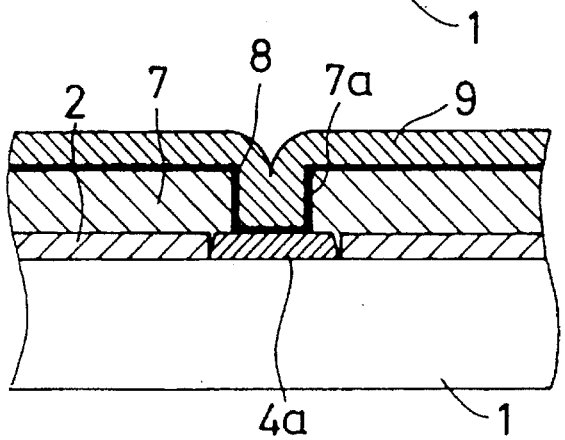
Figure 1E:
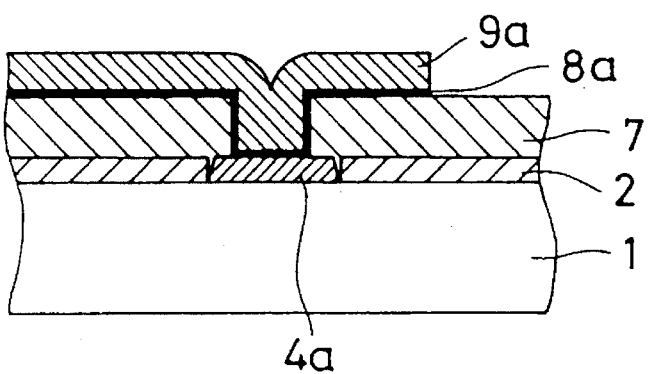

In the step of FIG. 1(d), the insulating film 2 and the Au-Ge/Ni/Au electrode 4a are covered with an insulating film 7, and a contact hole 7a is formed penetrating through the insulating film 7 by conventional photolithography and etching technique to expose the surface of the electrode 4a. Then, a WSiN film 8 is deposited on the surface of the insulating film 7, on the surface of the electrode 4a, and on the internal side walls of the contact hole 7a by reactive sputtering. Then, an Al film 9 for wiring deposited on the WSiN film 8 by sputtering. Since the WSiN film 8 formed in the reactive sputtering process offers good coverage, the surface of the electrode 4a exposed in the contact hole 7a and the internal side surface of the contact hole 7a are uniformly covered with the WSiN film 8. In addition, the Al film 9 is formed on the WSiN film 8 with high stability.

Thereafter, a prescribed resist pattern (not shown) is formed on the Al film 9. Using the resist pattern as a mask, unnecessary portions of the Al film 9 are removed by RIE using Cl gas and, subsequently, unnecessary portions of the WSiN film 8 are removed by RIE using $CF_4$ gas, resulting in a wiring layer having a desired pattern comprising the Al film 9a and the WSiN film 8a (FIG. 1(e)).

Thereafter, the device is subjected to a heat treatment at about 300° C. to make an ohmic contact between the GaAs substrate 1 and the Au-Ge/Ni/Au electrode 4a as well as to anneal the Al wiring layer 9a.

A description is given of the function of the WSiN film 6a interposed between the Au-Ge/Ni/Au electrode 4a and the Al wiring layer 9a. As described above, Au and Al easily react with each other, i.e., solid phase diffusion easily occurs between Au and Al. If heat is applied to the junction between Au and Al, an intermetallic compound, such as $AuAl_2$, is produced, increasing the contact resistance and reducing the mechanical strength at the junction. In the first embodiment of the present invention, however, since the WSiN film 6a interposed between the electrode 4a and the wiring layer 9a maintains its amorphous characteristic and is not crystallized even if it is subjected to a high temperature treatment at over 300° C., no solid phase diffusion occurs between the Au-Ge/Ni/Au electrode 4a and the Al wiring layer 9a during the heat treatment, and the undesirable reaction between Au in the electrode 4a and Al in the wiring layer 9a is prevented. Therefore, no intermetallic compound is formed between the Au-Ge/Ni/Au electrode 4a and the Al wiring layer 9a, whereby an increase in contact resistance and a reduction in the mechanical strength are avoided. In addition, since the Al wiring layer patterned in the RIE process is employed without reducing performance and reliability of the device, the size of the compound semiconductor device is reduced.

FIGS. 2(a)–2(e) are sectional views illustrating process steps in a method for connecting an electrode and a wiring layer in accordance with a second embodiment of the present invention. In the figures, the same reference numerals as in FIGS. 1(a)–1(e) designate the same or corresponding parts. Reference numeral 2a designates a contact hole.

Figure 2:
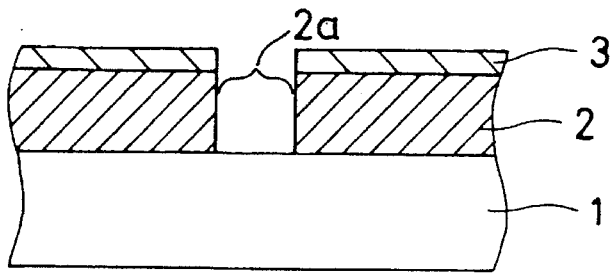
FIGS. 2(a)–2(e) are sectional views illustrating process steps for connecting an electrode and a wiring layer in a method of manufacturing a semiconductor device in accordance with a second embodiment of the present invention.
Figure 2:
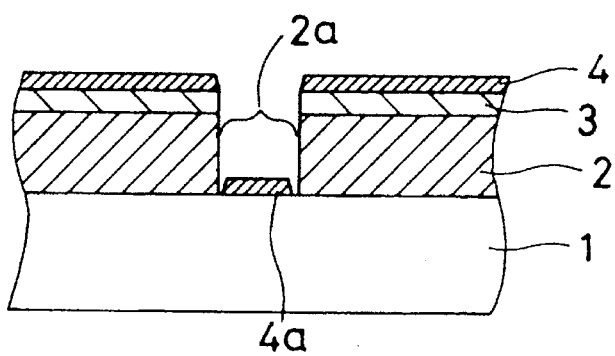
Figure 2:
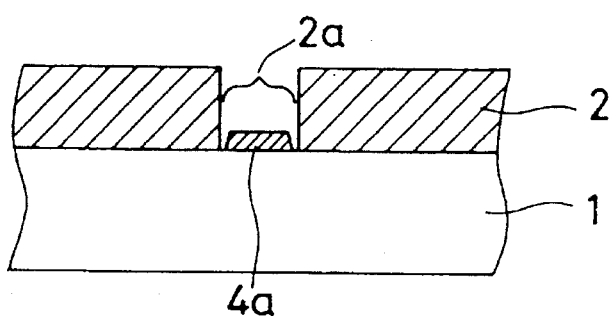
Figure 2:
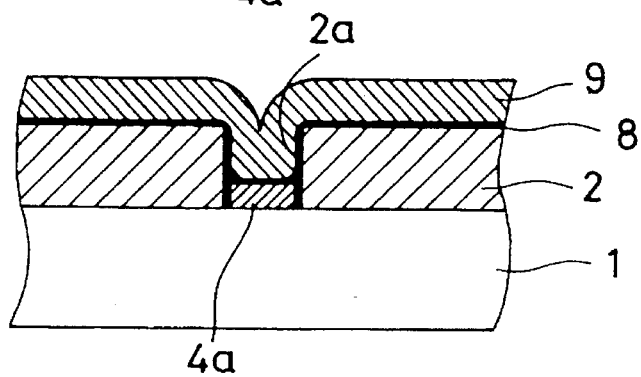
Figure 2:
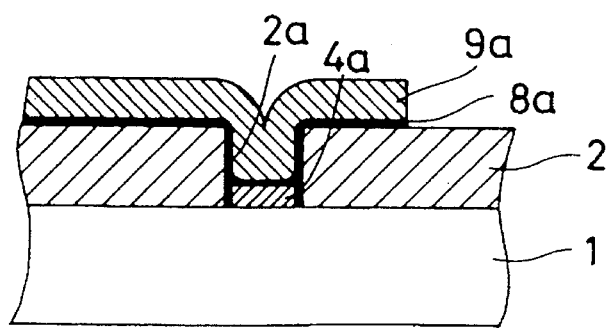

Initially, as illustrated in FIG. 2(a), an insulating film 2 is formed on the GaAs substrate 1, and a resist pattern 3 is formed on the insulating film 2 using a conventional photolithographic technique. Using the resist pattern as a mask, the insulating film 2 is dry etched to form a contact hole 2a.

In the step of FIG. 2(b), Au-Ge alloy, Ni, and Au are successively deposited over the entire surface of the GaAs substrate 1 using a vacuum evaporation process, forming a metal film 4 of Au-Ge/Ni/Au. Then, the resist pattern 3 and overlying portions of the metal film 4 are removed by a lift-off technique, leaving an electrode 4a on the GaAs substrate 1 in the contact hole 2a (FIG. 2(c)). The area of the electrode 4a is approximately equal to the base area of the contact hole 2a.

In the step of FIG. 2(d), a WSiN film 8 is deposited on the surface of the insulating film 2, on the surface of the Au-Ge/Ni/Au electrode 4a, and on the internal side surface of the contact hole 2a by reactive sputtering and, subsequently, an Al film 9 for wiring is deposited on the WSiN film 8 by sputtering. Since the WSiN film 8 formed in the reactive sputtering process offers good coverage, the surface of the electrode 4a in the contact hole 2a and the internal side surface of the contact hole 2a are uniformly covered with the WSiN film 8. In addition, the Al film 9 is on the WSiN film 8 is highly stable.

Thereafter, a prescribed resist pattern (not shown) is formed on the Al film 9 using a conventional photolithographic technique. Using the resist pattern as a mask, unnecessary portions of the Al film 9 are removed by RIE using Cl gas and unnecessary portions of the WSiN film 8 are removed by RIE using $CF_4$ gas, resulting in a wiring layer having a desired pattern comprising the Al film 9a and the WSiN film 8a (FIG. 2(e)).

Thereafter, the whole device is subjected to a heat treatment at about 300° C. to make an ohmic contact between the GaAs substrate 1 and the Au-Ge/Ni/Au electrode 4a as well as to anneal the patterned Al wiring layer 9a.

In the above-described method of producing a compound semiconductor device, since the Al wiring layer 9a is formed on the Au-Ge/Ni/Au electrode 4a via the WSiN film 6a, no intermetallic compound, such as $AuAl_2$, is formed between the Au-Ge/Ni/Au electrode 4a and the Al wiring layer 9a during the thermal treatment after the formation of the wiring layer on an electrode, whereby the increase in the contact resistance between the electrode and the wiring layer and a reduction in mechanical strength are avoided. In addition, since the Al wiring layer patterned in the RIE process is employed without reducing performance and reliability of the device, the size of the compound semiconductor device is reduced. Further, since the electrode 4a is formed after the formation of the contact hole 2a in the insulating film 2 and then the WSiN film 8 and the Al wiring layer 9a are formed, one photolithographic step is dispensed with compared to the above-described first embodiment, whereby the production is simplified. In addition, since the area of the electrode 4a is approximately equal to the base area of the contact hole 2a, the size of the device is further reduced.

Figure 3:
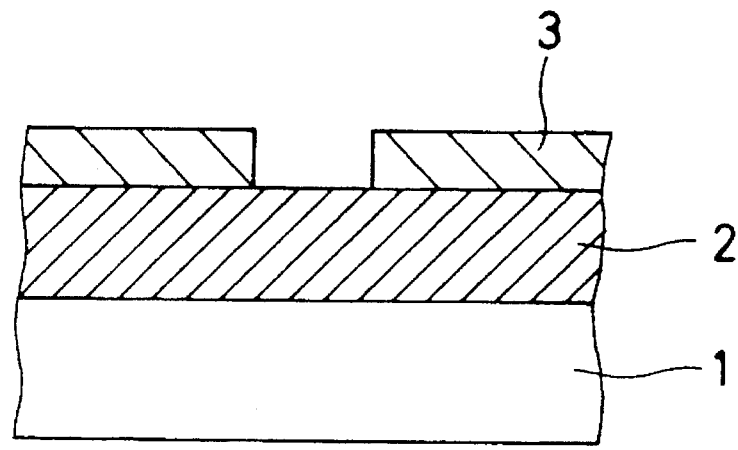
FIGS. 3(a)–3(c) are sectional views illustrating process steps for connecting an electrode and a wiring layer in a method of manufacturing a semiconductor device in accordance with a third embodiment of the present invention.
Figure 3:
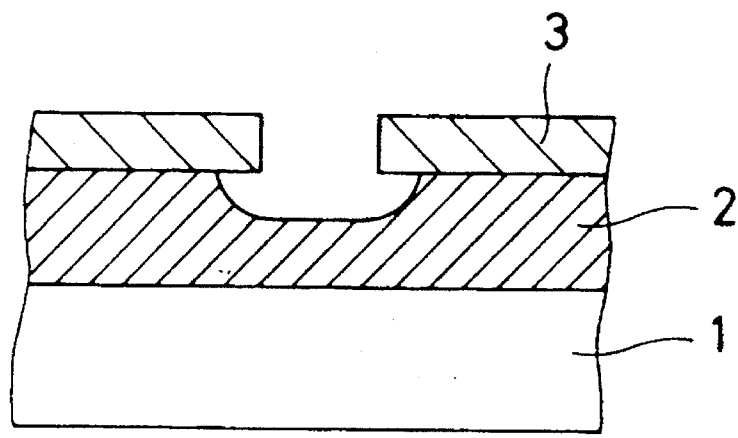
Figure 3:
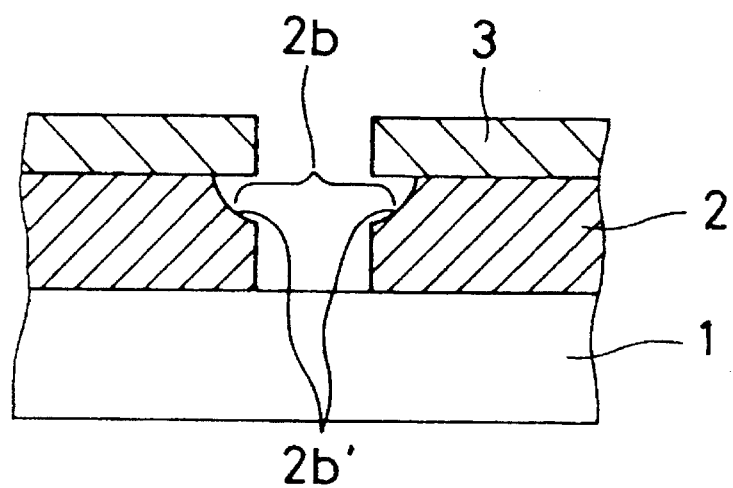

FIGS. 3(a)–3(c) are sectional views illustrating process steps for forming a contact hole in a method for manufacturing a compound semiconductor device in accordance with a third embodiment of the present invention. In the figures, the same reference numerals as in FIGS. 2(a)–2(e) designate the same or corresponding parts. Reference numeral 2b designates a contact hole.

In this third embodiment, after forming the resist pattern 3 on the insulating film 2 (FIG. 3(a)), an upper portion of the insulating film 2 is isotropically etched away using the resist pattern 3 as a mask (FIG. 3(b)) and then the insulating film 2 is anisotropically etched using a dry etching process to expose the surface of the GaAs substrate 1, whereby a contact hole 2b is produced as shown in FIG. 3(c). The process steps after the formation of the contact hole 2b are identical to those already described with respect to FIGS. 2(b)–2(e).

According to the third embodiment of the present invention, the same effects as described in the second embodiment are attained. In addition, even if the aspect ratio of the contact hole 2b is increased by reducing the aperture diameter of the contact hole 2b or by increasing the thickness of the insulating film 2, since the inclined surface 2b sloping toward the center of the contact hole 2b is present at the upper part of the contact hole 2b, the WSiN film 8 and the Al film 9 are deposited in the contact hole 2b with high stability, improving the reliability of the device.

Figure 4:
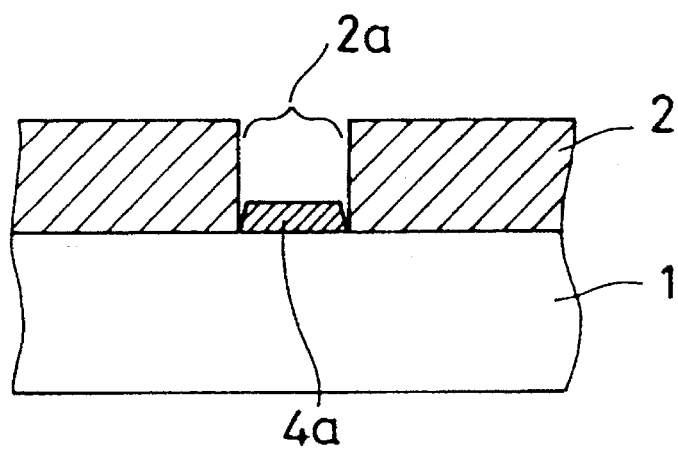
FIGS. 4(a)–4(c) are sectional views illustrating process steps for connecting an electrode and a wiring layer in a method of manufacturing a semiconductor device in accordance with a fourth embodiment of the present invention.
Figure 4:
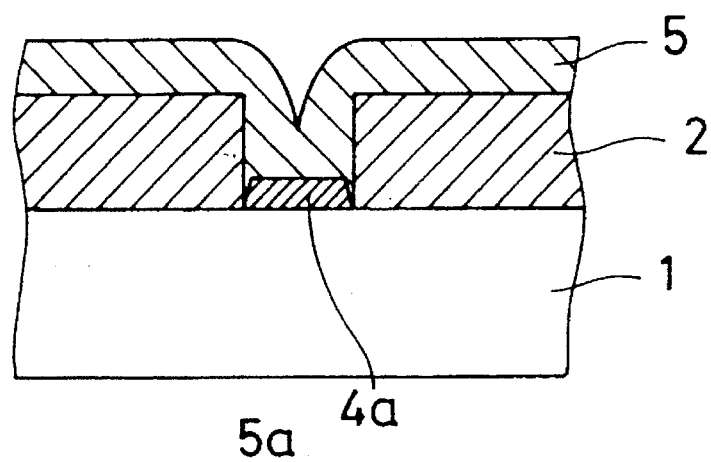
Figure 4:
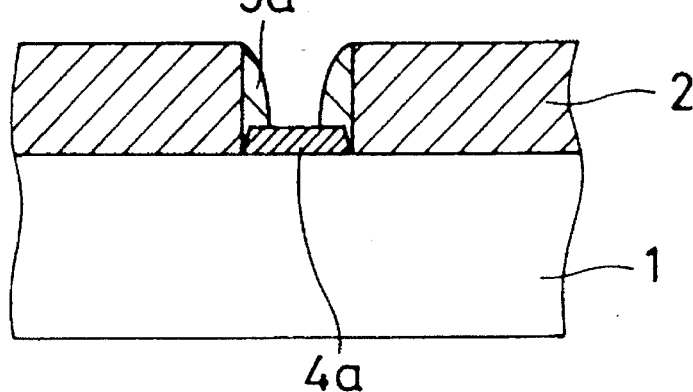

FIGS. 4(a)–4(c) are sectional views illustrating process steps for connecting an electrode and a wiring layer in accordance with a fourth embodiment of the present invention. In the figures, the same reference numerals as in FIGS. 2(a)–2(e) designate the same or corresponding parts. Reference numeral 5 designates an insulating film and reference numeral 5a designates a side wall.

After the electrode 4a is formed on the GaAs substrate 1 in the contact hole 2a according to the same process steps as already described with respect to FIGS. 2(a)–2(c) (FIG. 4(a)), an insulating film 5 is deposited over the entire surface of the substrate 1 to fill the contact hole 2a with the insulating film 5 (FIG. 4(b)). Then, a portion of the insulating film 5 is removed in a dry etching process to expose a region of the electrode 4a (FIG. 4(c)). Thereafter, the WSiN film 8a and the Al film 9a are formed according to the same process steps as already described with respect to FIGS. 2(d) and 2(e).

According to the fourth embodiment of the present invention, the same effects as described in the second embodiment are achieved. In addition, even if the aspect ratio of the contact hole 2a is increased by reducing the aperture diameter of the contact hole 2a or by increasing the thickness of the insulating film 2, since the side wall 5a has an inclined surface sloping toward the center of the contact hole 2a on the internal side surface of the contact hole 2a, the WSiN film 8 and the Al film 9 are deposited in the contact hole 2b with high stability, improving the reliability of the device.

FIGS. 5(a)–(f) are sectional views illustrating process steps for connecting an electrode and a metal wire in a method of manufacturing a compound semiconductor device in accordance with a fifth embodiment of the present invention. In the figures, reference numeral 11 designates an Si substrate. An Al film 12 is disposed on the Si substrate 11. A WSiN film 13 is disposed on the Al film 12. An electrode pattern 17 comprises the Al film 12 and the WSiN film 13. Reference numeral 14 designates a resist pattern having an aperture 14a. Reference numeral 15 designates an Au film and numeral 15a designates an Au film pattern. An Au wire 16 is disposed on the Au film patter 15a.

A description is given of the production process.

Figure 5:
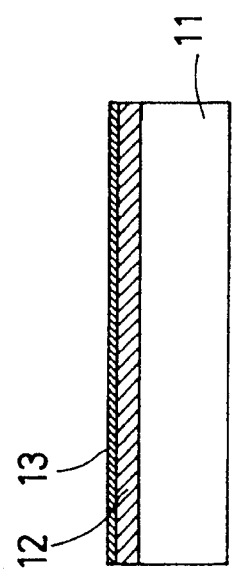
FIGS. 5(a)–5(f) are sectional views illustrating process steps for connecting an electrode and a metal wire in a method of manufacturing a semiconductor device in accordance with a fifth embodiment of the present invention.
Figure 5:
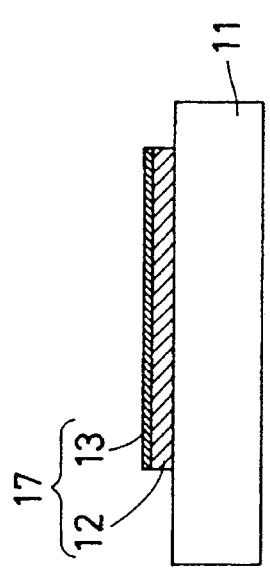
Figure 5:
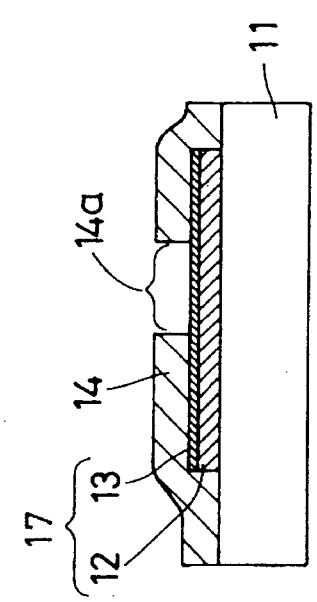
Figure 5:
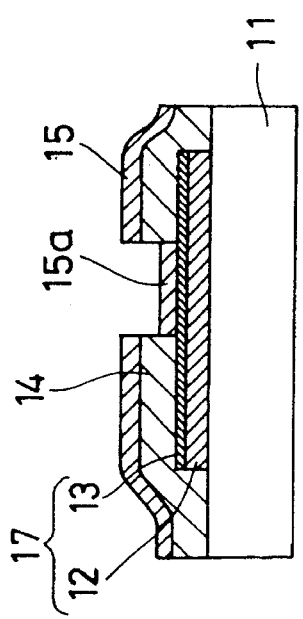
Figure 5:
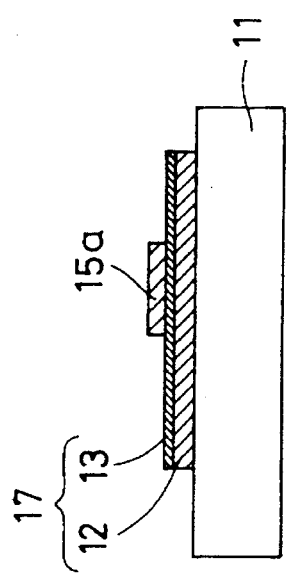
Figure 5:
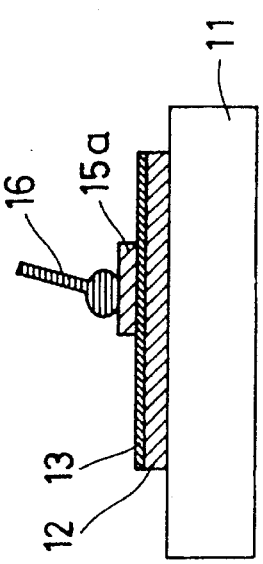

Initially, as illustrated in FIG. 5(a), an Al film 12 is formed on the Si substrate 11 by sputtering and then a WSiN film 13 is formed on the Al film 12 by reactive sputtering. Thereafter, a resist pattern (not shown) is formed on the surface using conventional photolithographic technique. Using the resist pattern as a mask, unnecessary portions of the WSiN film 13 and the Al film 12 are removed by RIE (FIG. 5(b)). Preferably, the WSiN film 13 is etched with $CF_4$ gas and the Al film 12 is etched with Cl gas. Then, the resist pattern is removed to form an electrode pattern 17.

In the step of FIG. 5(c), a resist film is deposited on the entire surface, and an aperture 14a is formed opposite a prescribed region of the electrode pattern 17 by a conventional photolithographic technique.

In the step of FIG. 5(d), an Au film 15 is deposited over the entire surface of the Si substrate 11 using a vacuum evaporation process, and the resist pattern 14 and overlying portions of the Au film 15 are removed by a lift-off technique, leaving an Au film pattern 15a on the prescribed region of the electrode pattern 17.

In the step of FIG. 5(f), an Au wire 16 is connected to the surface of the Au film pattern 15 using a nail head bonding process. The Au wire 16 and the Au film pattern 15a are connected to each other with high thermal and mechanical stability. In addition, the WSiN film 13 maintains its amorphous characteristic and is not crystallized even if it is subjected to a high temperature treatment at over 300° C. and, therefore, solid phase diffusion between the Au film pattern 15a and the Al film 12 does not occur during the wire bonding process, and the undesirable reaction between Au in the Au film pattern 15a and Al in the Al film 12 is prevented. Therefore, no intermetallic compound, such as $AuAl_2$, is formed between the Al film 12 and the Au film pattern 15a, so that the contact resistance between the electrode and the wire is not increased and mechanical strength is not reduced.

While in the above-described fifth embodiment the Au film pattern 15a is formed after the formation of the electrode pattern 17, the Au film 15 may be deposited on the WSiN film 13 in the step of FIG. 5(a) and, thereafter, the electrode pattern 17 may be formed.

While in the above-described first to fifth embodiments the WSiN film is employed as a film interposed between the Al film and the Au film (Au wire), the film may comprise other materials so long as it does not react with the Al film nor the Au film (Au wire) and maintains an amorphous characteristic and is not crystallized at a high temperature, e.g., over 300° C.

In addition, while in the above-described first to fifth embodiments the ohmic electrode is formed on the semiconductor substrate, the present invention may be applied to a semiconductor device in which an electrode makes an electrical contact other than to an ohmic contact to a semiconductor substrate.

As is evident from the foregoing description, according to the present invention, an electrode and a wiring layer comprising different metals that form an intermetallic compound at a junction between them when heat is applied are connected via a barrier metal layer which prevents solid phase diffusion of the metals of the electrode and the wiring layer even when heat is applied. Therefore, the electrode and the wiring layer are connected without increasing the contact resistance or reducing mechanical strength. As a result, the degree of freedom in selecting the materials of the electrode and the wiring layer is increased.

Furthermore, according to the present invention, a metal electrode is covered with a barrier metal layer which prevents solid phase diffusion of the metal electrode and a wire comprising a metal different from the metal of the electrode even when heat is applied. A metal layer comprising the same metal as the wire is formed on the barrier metal layer, and the wire is bonded on the metal layer. Therefore, the electrode and the wire are connected without increasing contact resistance or reducing mechanical strength. As a result, the degree of freedom in selecting materials of the electrode and the wire is increased.

What is claimed is:

1. A method for manufacturing a semiconductor device including:

depositing an insulating film on a GaAs substrate and forming a resist pattern having an aperture on the insulating film;

using the resist pattern as a mask, anisotropically etching the insulating film to form an aperture having a side surface and exposing a part of the GaAs substrate;

depositing a first metal film including an Au layer on the surface of the GaAs substrate and removing the resist pattern and portions of the first metal film on the resist pattern to form an electrode on the GaAs substrate in the aperture in the insulating film;

forming a WSiN barrier metal layer on and in contact with the Au layer of the electrode in the aperture, on the internal side surface of the aperture, and on the insulating film; and depositing a second metal film including Al on the WSiN barrier metal layer and patterning the second metal film and the barrier metal layer to form a wiring layer.

2. The method of claim 1 including depositing the WSiN film by reactive sputtering.

3. A method for manufacturing a semiconductor device including:

depositing an insulating film on a semiconductor substrate and forming a resist pattern having an aperture on the insulating film;

using the resist pattern as a mask, isotropically etching the insulating film and subsequently anisotropically etching the insulating film to form an aperture exposing a part of the semiconductor substrate, the aperture having a sloping internal side surface oblique to the semiconductor substrate and a contiguous internal side surface generally perpendicular to the semiconductor substrate;

depositing a first metal film on the surface of the semiconductor substrate in the aperture in the insulating film and removing the resist pattern and portions of the first metal film on the resist pattern to form an electrode on the semiconductor substrate in the aperture in the insulating film;

forming a barrier metal layer on the electrode in the aperture, on the internal side surfaces of the aperture, and on the insulating film; and depositing a second metal film on the barrier metal layer and patterning the second metal film and the barrier metal layer to form a wiring layer wherein the barrier metal layer comprises a metal that does not form an intermetallic material by solid state diffusion with either of the first and second metal films even at elevated temperatures.

4. The method of claim 3 wherein the semiconductor substrate comprises GaAs, the first metal film includes an Au layer in contact with the barrier metal layer, and the barrier metal layer comprises WSiN.

5. The method of claim 4 including depositing the WSiN film by reactive sputtering.

6. A method for manufacturing a semiconductor device including:

depositing an insulating film on a semiconductor substrate and forming a resist pattern having an aperture on the insulating film;

using the resist pattern as a mask, anisotropically etching the insulating film to form an aperture having an internal side wall surface exposing a part of the semiconductor substrate;

depositing a first metal film on the surface of the semiconductor substrate and removing the resist pattern and portions of the first metal film on the resist pattern to form an electrode on the semiconductor substrate in the aperture in the insulating film;

forming a side wall of a second insulating film on the internal side surface of the aperture of the insulating film;

forming a barrier metal layer on the electrode in the aperture, on the internal side surface of the aperture, and on the insulating film; and depositing a second metal film on the barrier metal layer and patterning the second metal film and the barrier metal layer to form a wiring layer wherein the barrier metal layer comprises a metal that does not form an intermetallic material by solid state diffusion with either of the first and second metal films even at elevated temperatures.

7. The method of claim 6 wherein the semiconductor substrate comprises GaAs, the first metal film includes an Au layer in contact with the barrier metal layer, and the barrier metal layer comprises WSiN.

8. The method of claim 7 including depositing the WSiN film by reactive sputtering.

* * * * *